(12) United States Patent
Nishidate (10) Patent No.: US 7,861,254 B2
(45) Date of Patent: Dec. 28, 2010

(54) OPTICAL PICKUP

(75) Inventor: Tetsuo Nishidate, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 367 days.

(21) Appl. No.: 12/078,915

(22) Filed: Apr. 8, 2008

(65) Prior Publication Data

US 2008/0247297 A1 Oct. 9, 2008

(30) Foreign Application Priority Data

Apr. 9, 2007 (JP) ............................. P2007-101547

(51) Int. Cl.
*G11B 7/00* (2006.01)
(52) U.S. Cl. ..................... 720/663; 720/672; 369/44.14; 369/112.27; 369/121
(58) Field of Classification Search ........................ None
See application file for complete search history.

(56) References Cited

FOREIGN PATENT DOCUMENTS

| JP | 04-30374 A | 2/1992 |
|---|---|---|
| JP | 2000-331372 | 11/2000 |

*Primary Examiner*—Wayne R Young
*Assistant Examiner*—Brian Butcher
(74) *Attorney, Agent, or Firm*—Morgan, Lewis & Bockius LLP (57) ABSTRACT

An optical pickup includes: a slide base, having: a first surface; and a second surface; a first substrate fixed to the first surface; a standing frame disposed on the second surface; a second substrate facing the standing frame; a laser diode operable to emit a laser beam to the disk and disposed in the standing frame; an optical, element supported by the second substrate and adapted to receive a reflected beam; a flexible flat cable. The flexible flat cable is bent so that one end portion of the flexible flat cable is connected to the second substrate. A curved portion is formed with a slit elongated in a longitudinal direction of the flexible flat cable and defines an outer portion and an inner portion. A width of the inner portion is narrower than a width of the outer portion.

6 Claims, 9 Drawing Sheets

PRIOR ART

OPTICAL PICKUP

BACKGROUND

1. Field of the Invention

The present invention relates to an optical pickup that, is used in a disc device (for example, a DVD recorder, a DVD player, or the like), and more particularly, a disc device capable of preventing a read error by maintaining three-dimensional adjustment and rotation adjustment of a photo detector over a long period.

2. Description of the Related Art

Figure 4:
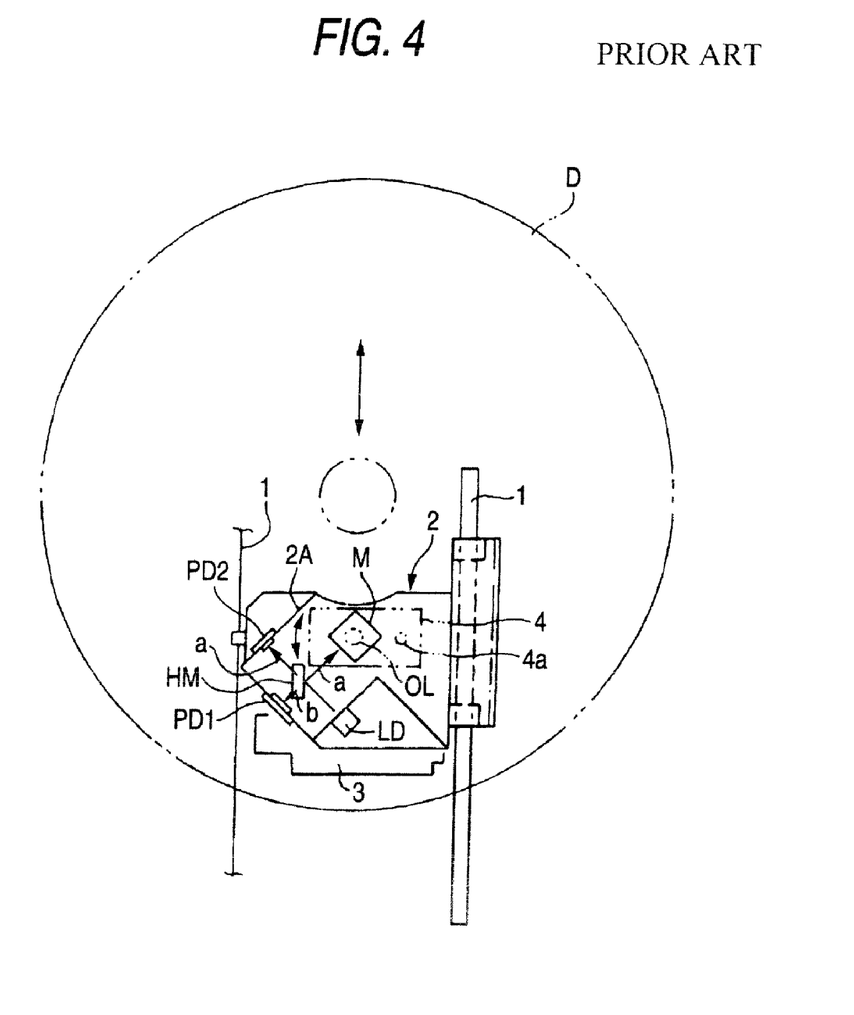
FIG. 4 is a schematic plan view of an optical pickup.

An overview of an optical pickup will be described with reference to FIG. 4. In the optical pickup, a slide base 2 is engaged with, a pair of left and right guide rails 1 disposed along the radial direction pf a disc D to be able to reciprocate. In addition, between surface and bottom sides of the slide base 2, a main substrate 3 formed of a printed circuit board is fixed to one side, and a standing frame 2A is integrally formed or the other side. In the standing frame 2A, a photo detector PD1, a light intensity detector PD2, and a laser diode LD are positioned to be fixed. In addition, within the standing frame 2A, a standing mirror M and a half mirror HM are disposed, and an actuator 4 having an objective lens OL is disposed on one side of the slide base 2.

Hereinafter, the sequence of reading information will be described. The disc D is rotated at high speed and the actuator 4 is driven such that the objective lens OL is moved in a focus direction along a spindle 4a disposed in the actuator 4 and the objective lens OL is moved in the tracking direction around the spindle 4a. Then, a laser beam a emitted from the laser diode LD is reflected by the half mirror HM and the standing mirror M, and is transmitted through the objective lens OL to be projected onto the disc D. Then, reflection light b is transmitted through the objective lens OL, reflected by the standing mirror M, transmitted through the half mirror HM, and received by the photo detector PD1, so that information recorded in the disc D is read out and the intensity of the laser beam a is detected by the light intensity detector PD2.

Figure 5:
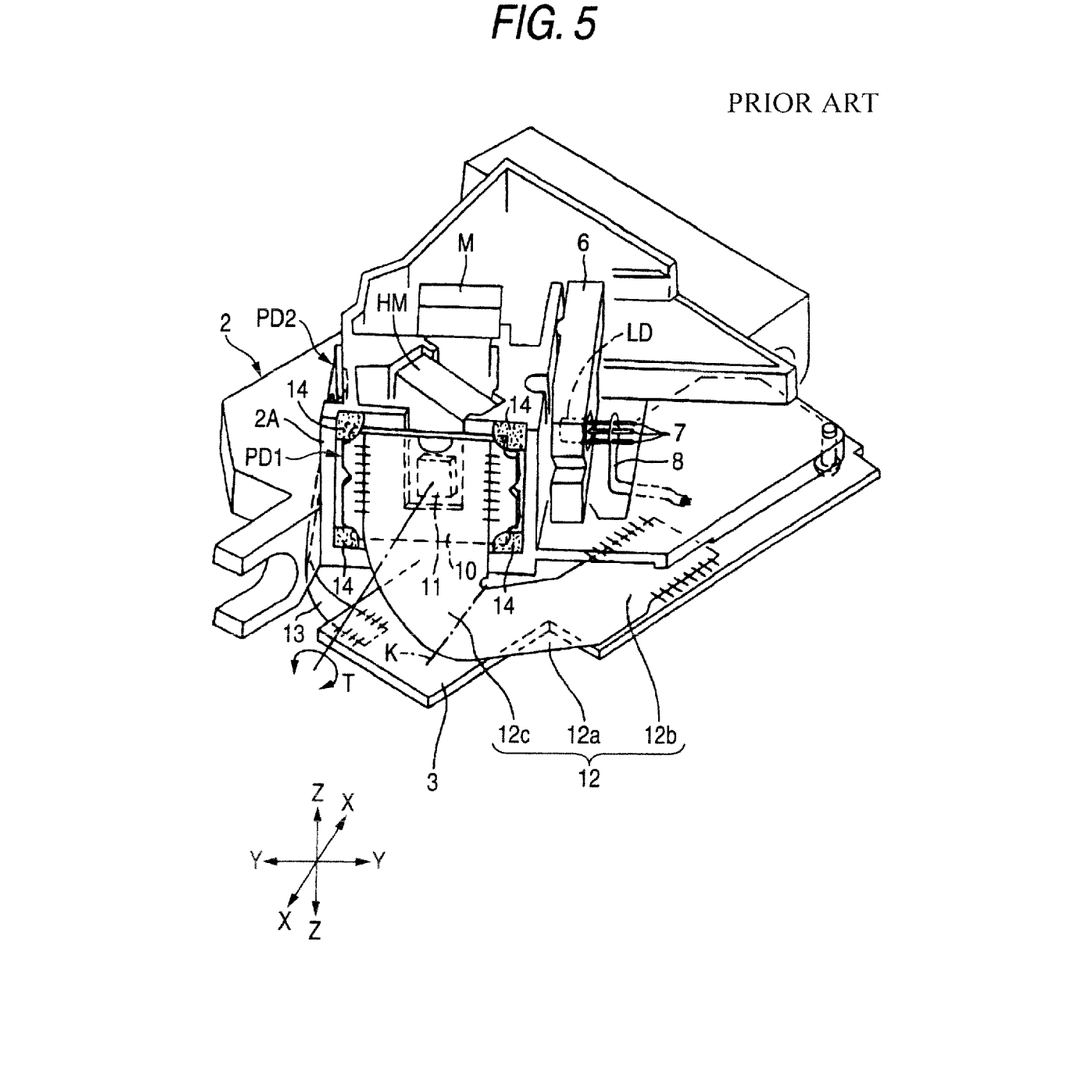
FIG. 5 is a perspective view of an example of an optical pickup.
Figure 6:
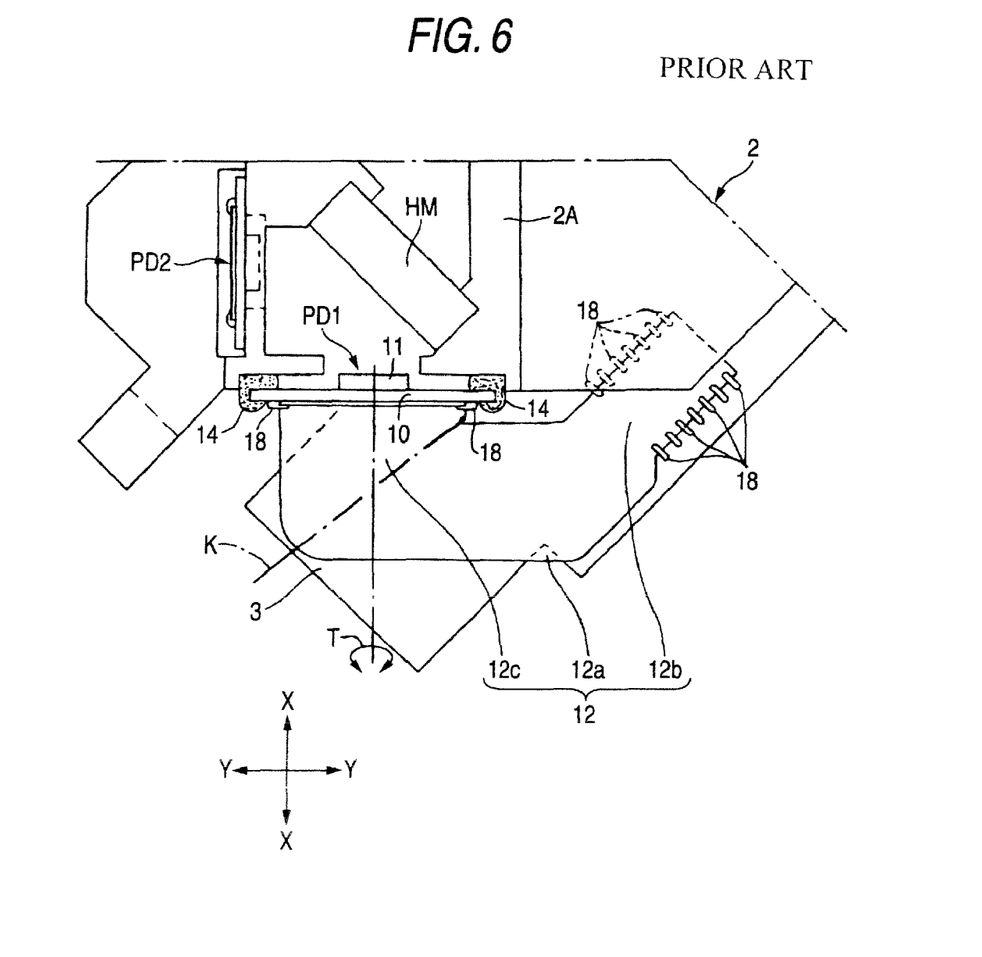
FIG. 6 is a plan view of major parts of the optical pickup.
Figure 7:
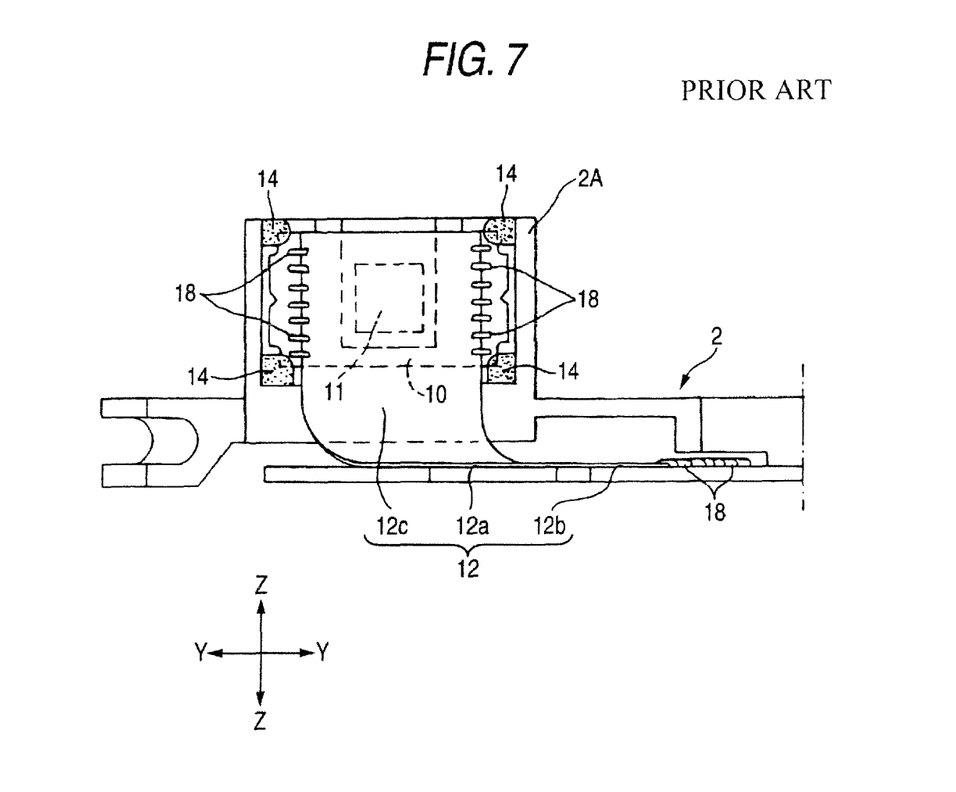
FIG. 7 is a front view of the major parts.
Figure 8A:
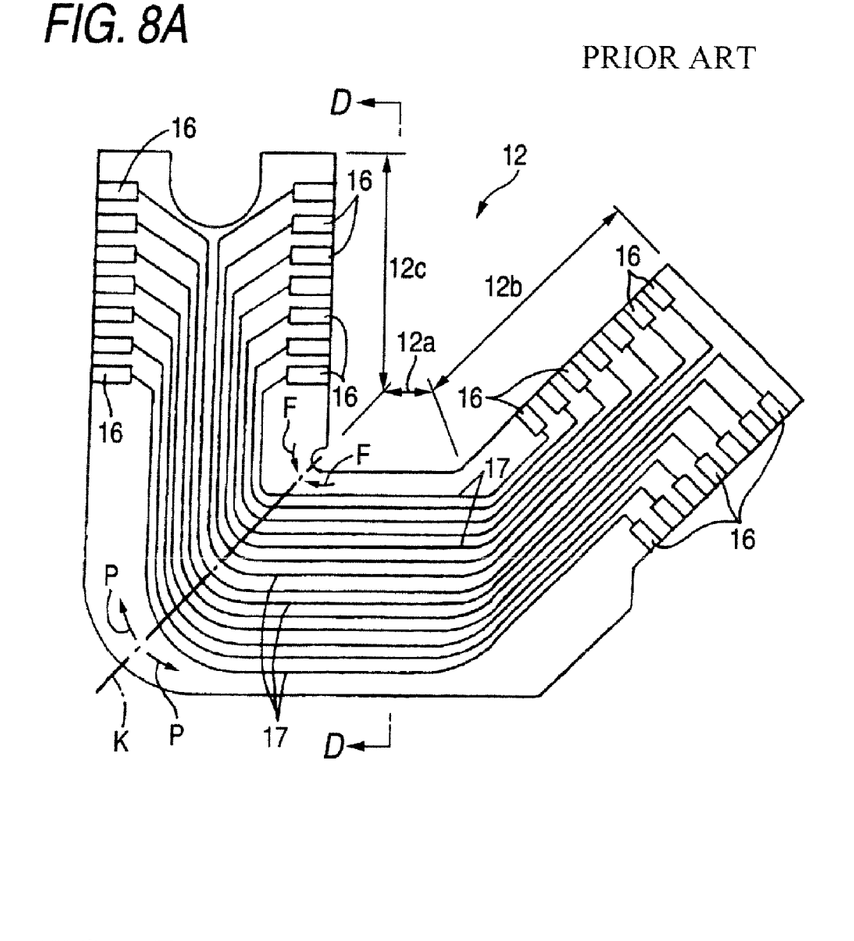
FIG. 8A is a development view of a photo detector conducting wire of the optical pickup.
Figure 8B:
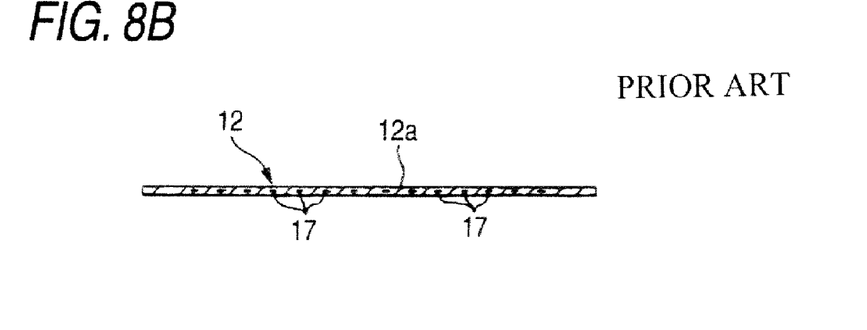
FIG. 8B is a view along arrow D-d of FIG. 8A.

FIGS. 5 to 8B show an example of a general optical pickup. FIG. 5 is a perspective view of the general optical pickup. FIG. 6 is a plan view of major parts of the general optical pickup. FIG. 7 is a front view of the major parts. FIG. 8A is a development view of a photo, detector conducting wire of the general pickup. FIG. 8B is a view along arrow D-D of FIG. 3A.

As shown in FIG. 5, the laser diode LD is fitted in through a hole, which is formed by perforating a center portion of a holder 6 made of a metal block, to be fixed, and an end portion of a laser diode conducting wire 8 formed of a flexible flat cable that is soldered to a terminal shaft 7 of the laser diode LD is soldered to the main substrate 3.

As shown in FIGS. 5 to 7, the photo detector PD1 is formed by attaching an optical element 11 formed of a photo diode to a support substrate 10 formed of a printed circuit board. The photo detector PD1 is connected to the main substrate 3 through the photo detector conducting wire 12 formed of a flexible flat cable. The structure of the light intensity detector ED2 is the same, as that, of the photo detector PD1. The light intensity detector PD2 is connected to the main substrate 3 through a light intensity detection conducting wire 13 formed of a flexible flat cable.

The sequence of fixing the photo detector PD1 will now be described. The photo detector PD1 is three-dimensionally adjusted in front and rear directions X, in left and right directions Y, and upper and down directions Z with respect to the standing frame 2A, and rotation adjustment T for the photo detector PD1 is performed. Then, by injecting an adhesive agent. 14 such as an ultraviolet curable adhesive agent between the standing frame 2A and the support substrate 10, the photo detector PD1 is fixed to the standing frame 2A.

As shown in FIGS. 8A and 8B, the photo detector conducting wire 12 is formed in an approximate "n" shape by a center portion 12a, one end portion 12b that extends from the center portion 12a at a predetermined tilt angle (in this example, 45°) in one direction, and the other end portion 12c that extends from the center portion 12a at a predetermined tilt angle (in this example, 90°) in another direction. In the inner and outer edges of the end portions 12b and 12c, a plurality of (in this example, seven for each edge) lands 16 is formed, and lands 16 disposed in both the end, portions 12b and 12c are connected together though a plurality of (in this example 14) connect ion wires 17 that pass through the center portion 12a.

The sequence of connecting the photo detector conducting wire 12 will now be described. As shown in FIGS. 6 and 7, the lands 16 disposed in the one end portion 12b are soldered to lands 18 of the main substrate 3, the other end portion 12c is bent to rise in the boundary K between the center portion 12a and the other end portion 12c, and the lands 16 of the other end portion 12c are spidered to the lands 18 of the support substrate 10, as disclosed in Japanese Patent Publication No, 2000-331372.

In the above-described configuration, the photo detector conducting wire 12 is formed of a flexible flat cable having a large width. Accordingly, when the other end portion 12c thereof, is bent to stand in the boundary K, a strong pulling force P is generated along the outer edge of the photo detector conducting wire 12 from the boundary K, and a strong compressing force F is generated along the inner edge of the photo detector conducting wire 12. Thus the strong pulling force P and the strong compressing force F are applied to the adhesive, agent 14 that supports the photo detector, and the adhesive agent 14 is deformed in a case where the adhesive agent is exposed, in a high-temperature environment such as a curing process or a warehouse. As a result, the three-dimensional, adjustment XYZ and rotation adjustment of the photo detector PD1 may be performed incorrectly, and thereby there is a possibility of generation of a read error.

SUMMARY

It is therefore, one advantageous aspect of the invention to provide an optical pickup capable of preventing a read error by maintaining the three-dimensional adjustment and rotation adjustment of the photo detector for a long time.

According to one aspect of the present invention, there is provided an optical pickup including a slide base adapted to move along a radial direction of a disc and having a first surface; and a second surface; a first substrate fixed to the first surface and comprising a printed circuit board; a standing frame, disposed oh the second surface; a second substrate facing the standing frame and comprising a printed circuit board; a laser diode operable, to emit a laser beam to the disk and disposed in the standing frame; an optical element supported by the second substrate and adapted to receive a light beam reflected, from the disk; and a flexible flat cable including a first end portion; a second end portion; and a curved portion disposed between the first end portion arid the second end portion, wherein: the first end portion is connected to the first substrate; the flexible flat cable is bent so that the second end portion connected to the second substrate; the curved portion, is formed with a slit elongated in a longitudinal direction of the flexible flat cable and defining an outer portion and an inner portion; and a width of the inner portion is narrower than a width of the outer portion.

According to the above, the pulling force and the compressing force that are applied to the flexible flat cable are dispersed to both inner and outer conducting wires of the flexible flat cable by dividing the center portion of the flexible flat cable into two including the outer conducting wire and the inner conducting wire. In addition, since the width of the inner conducting wire is set to be smaller than that of the outer conducting wire, the inner conducting wire can be easily bent in correspondence with a decrease in the width of the inner conducting wire, and thereby the pulling force and the compressing force that are applied to the inner conducting wire decrease. Accordingly, the pulling force and the compressing force that are applied to the inner conducting wire do not act on the adhesive agent that supports the photo detector, and thereby the adhesive agent is not deformed even when the adhesive agent is exposed to a high-temperature environment such as a curing process or a warehouse. Therefore, a read error can be prevented by maintaining the three-dimensional adjustment and rotation adjustment of the photo detector for a log time.

The width of the outer portion may be 1.4 to 3 times wider than the width of the inner portion. Further, the width of the outer portion may be 1.5 to 2.5 times wider than the width of the inner portion.

According to the above, when the ratio of the width of the outer conducting wire to that of the Inner conducting wire is smaller than 3 to 1, the width of the inner conducting wire, is sexually and accordingly the pulling force P and the compressing force F that are applied to the inner conducting wire rarely act on the adhesive agent that supports the photo detector. However, since the width of the Outer conducting wire is increased in correspondence with the decrease in the Width of the inner conducting wire, the shape of the flexible flat cable is approximately the same as that of a general flexible; flat cable in which a slit is not formed. Accordingly, the pulling force and the compressing force that are applied to the outer conducting wire become considerably strong, and are applied to the adhesive agent that supports the photo detector. Therefore, the adhesive agent may be deformed in a case where the photo detector is exposed in a high-temperature environment such as a curing process or a warehouse. As a result, the three-dimensional adjustment and rotation adjustment of the ephoto, detector may be performed incorrectly, and thereby there is a possibility of generation of a read error.

When the ratio of the width of the Outer conducting wire to that of the inner conducting wire exceeds the ratio of 7 to 5 the width of the inner conducting wire is not quite different from that of the outer conducting wire. Accordingly, the shape of the flexible flat cable is approximately the same as that of a general photo detector in which the ratio of the width of the inner conducting wire to that of the outer conducting wire is 1 to 1. Thus, the pulling force and the compressing force that are applied to the inner conducting wire become considerably strong, and act on the adhesive agent: that supports the photo detector. Therefore, the adhesive agent is deformed in a case where the adhesive agent is exposed in a high-temperature environment such as a curing process or a warehouse, and there is the above-described defect.

According to the above, the ratio of the width of the outer conducting wire to that of the inner conducting wire is set to be in the range of 3 to 1 to 7 to 5 (preferably in the range of 2.5 to 1 to 1.5 to 1), and the pulling force and the compressing force that are applied to the flexible flat cable are dispersed to both inner and outer conducting wires of the flexible flat cable by dividing the center portion of the flexible flat cable into two including the outer conducting wire and the inner conducting wire. In addition, since the width of the inner conducting wire is set to be appropriately smaller than that of the outer conducting wire, the inner conducting wire can be easily bent in correspondence with a decrease in the width of the inner conducting wire, and thereby the pulling force and the compressing force that are applied to the inner conducting wire decrease. Accordingly, the pulling force and the compressing force that are applied to the inner conducting wire do not act on the adhesive agent that supports the photo detector, and thereby the adhesive agent is not deformed even when the adhesive agent is exposed to a high-temperature environment such as a curing process or a warehouse. Therefore, a read error can be prevented by maintaining the three-dimensional adjustment and rotation adjustment of the photo detector for a long time.

The width of the slit may fall within a range from 1 mm to 3 mm. Further, the width of the slit, may fall within a range, from 1.5 to 2.5 mm.

According to the above, when the width of the slit is smaller than 1 mm, the width of the slit is too small, and both the inner and outer conducting wires way be brought into contact with each other in a case where the other end portion of the flexible flat cable is bent in the boundary, and thereby there is a possibility that remaining load is applied to the adhesive agent.

On the other hand, when the width of the slit exceeds 3 mm, the width of the slit is too large, and accordingly a gap between the inner and outer conducting wires decreases in correspondence with an increase in the width of the slit. As a result, it is difficult, to appropriately dispose a plurality of connection wires in both the inner and outer conducting wires with a predetermined gap interposed therebetween.

According to the third aspect of the invention, since the width of the slit is set to be in the range of 1 to 3 (preferably in the range of 1.5 to 2.5) mm, the width of the slit is an appropriate size. Accordingly, both the inner and outer conducting wires are not: brought into contact with each other in a case where the other end portion of the flexible flat cable is bent in the boundary. In addition, the widths of the inner and outer conducting wires are set to be large as possibly as can be, and therefore a plurality of connection, wires can be appropriately disposed in both the inner and outer conducting wires With a predetermined gap interposed therebetween.

BRIEF DESCRIPTION OF THE DRAWINGS

Embodiment may be described in detail with reference to the accompanying drawings, in which.

DETAILED DESCRIPTION OF THE INVENTION

Figure 9A:
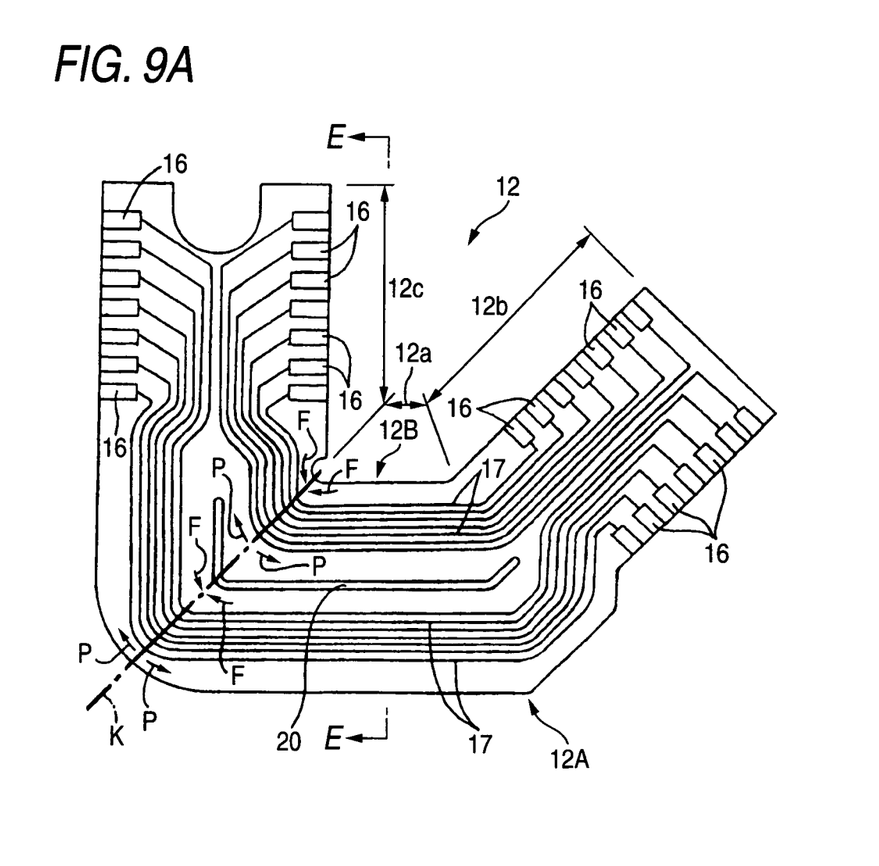
FIG. 9A is a development view of an example of a photo detector conducting wire.
Figure 9B:
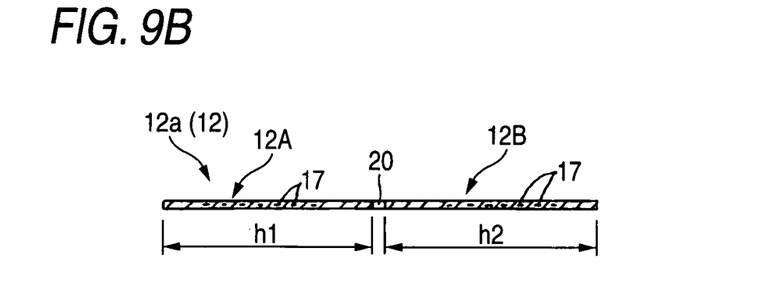
FIG. 9B is a view along arrow E-E of FIG. 9A.

As shown in FIG. 9A that is a development view of a photo detector conducting wire and FIG. 9B that is a view along arrow E-E of FIG. 9A, a method of dispersing a pulling force P and a compressing force F to both an inner and outer conducting wires 12A and 12B by forming a slit 20 along a longitudinal direction of a conducting wire 12 from a center portion 12a of the photo detector conducting wire 12 to an other end portion 12c through a boundary K and dividing the center portion 12a of the photo detector conducting wire 12 into two including the outer conducting wire 12A and the inner conducting wire 12B may be considered. However, in such a case, the ratio of a width h1 of the outer conducting wire 12A to a width h2 of the inner conducting wire 12B is 1 to 1, the width h2 of the inner conducting wire 12B is large, and the inner conducting wire 12B is bent at a steep angle. Accordingly, the pulling force P and the compressing force F that are applied to the inner conducting wire 12B are considerably strong, and are applied to the adhesive agent 14 that supports a photo detector PD 1.

Figure 1A:
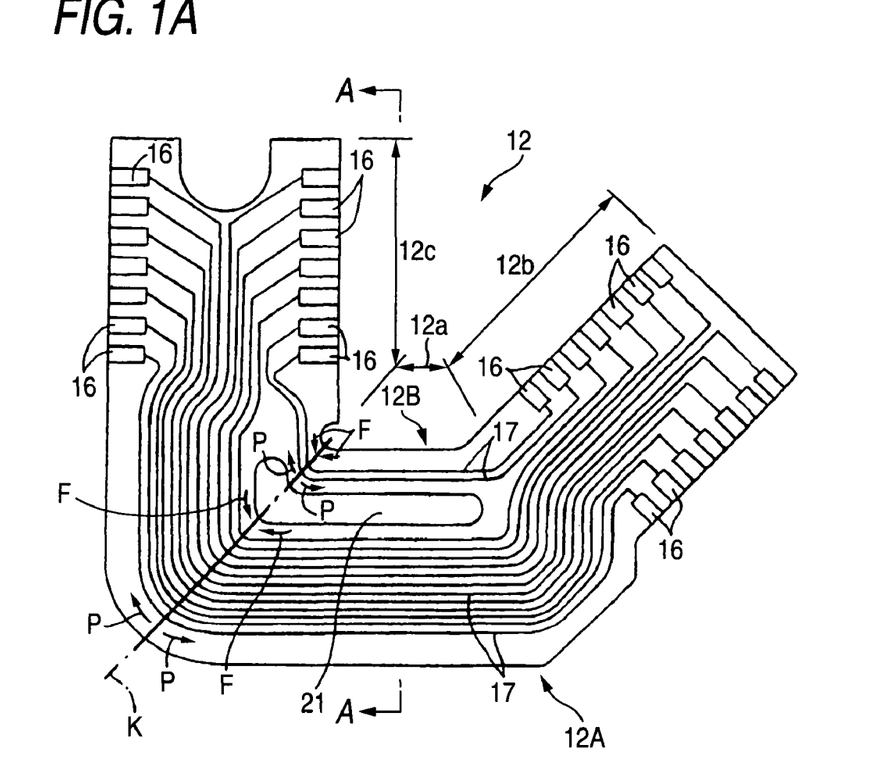
FIG. 1A is a development view of a photo detector conducting wire of an optical pickup according to one embodiment of the present invention.
Figure 1B:
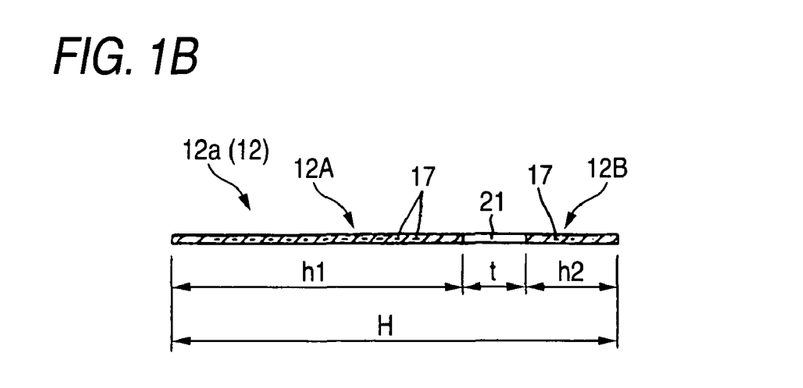
FIG. 1B is a diagram along arrow A-A of FIG. 1A.

Therefore, according to an exemplary embodiment of the present invention, FIGS. 1A and 1B show major parts of an optical pickup according to a first embodiment of the present invention. FIG. 1A is a development view of a photo detector conducting wire of the optical pickup. FIG. 1B is a view along arrow A-A of FIG. 1A.

As shown in FIGS. 1A and 1B, a center portion 12a of the photo detector conducting wire 12. Is divided into two including an outer conducting wire 12A and an inner conducting wire 12B by forming a slit 21 having a predetermined width t along the longitudinal direction the conducting wire 12 from the center portion 12a of the photo detector conducting wire 12 to the other end portion 12c through a boundary K. In addition, the ratio of the width h1 of the outer conducting wire 12A to the width h2 of the inner conducting wire 12B is set to 3 to 1. Since other configurations are approximately the same as those shown in FIGS. 4 to 7, a same reference number is assigned to a same portion, and a description thereof is omitted here.

To describe an example of specific measurements, the width. H of the center portion 12a is 1.4 mm, the width t of the slit 21 is 2 mm, the width h1 of the outer conducting wire 12A is 9 mm, and the width h2 of the inner conducting wire 12B is 3 mm.

Figure 2A:
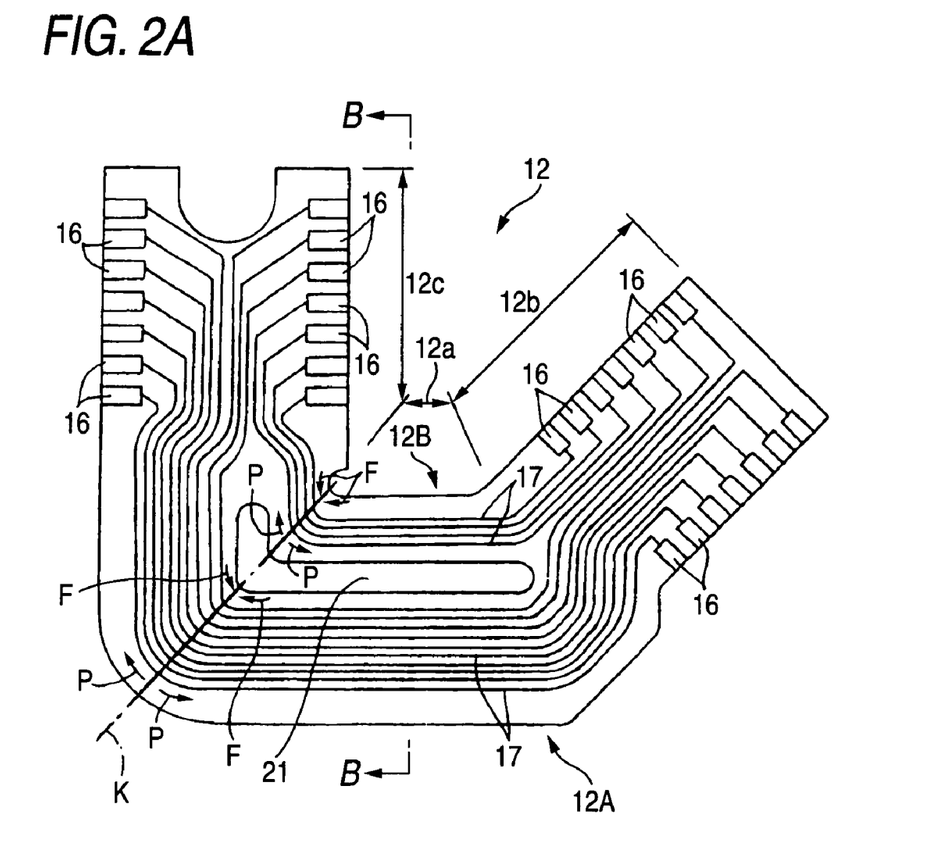
FIG. 2A is a development view of a photo detector conducting wire of an optical pickup according to another embodiment of the present invention.
Figure 2B:
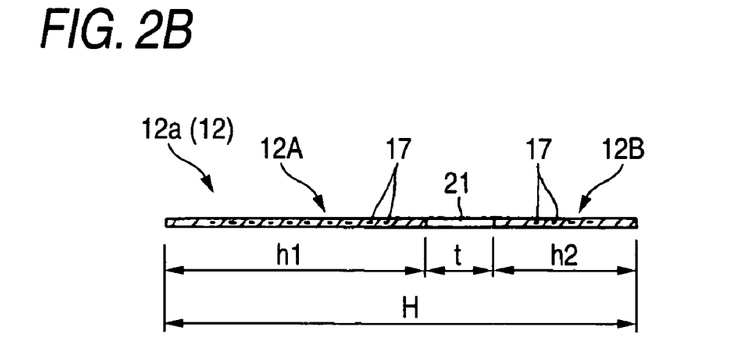
FIG. 2B is a diagram along arrow B-B of FIG. 2A.

FIGS. 2A and 2B show major parts of an optical pickup according to a second embodiment of the present invention. FIG. 2A is a development view of a photo detector conducting wire of the optical pickup, and FIG. 2B is a view along arrow B-B of FIG. 2A.

As shown in FIGS. 2A and 2B, the ratio of the width h1 of the outer conducting wire 12A to the width h2 of the inner conducting wire 12B is set to 2 to 1. Since other configuration's are approximately the same as those shown in FIGS. 1A and 1B, a same reference number is assigned to a same portion, and a description thereof is omitted here.

To describe an example of specific measurements, the width H of the center portion 12a is 14 mm, the width t of the slit 21 is 2 mm, the width h1 of the outer conducting wire 12A is 8 mm, and the width h2 of the inner conducting wire 12B is 4 mm.

Figure 3A:
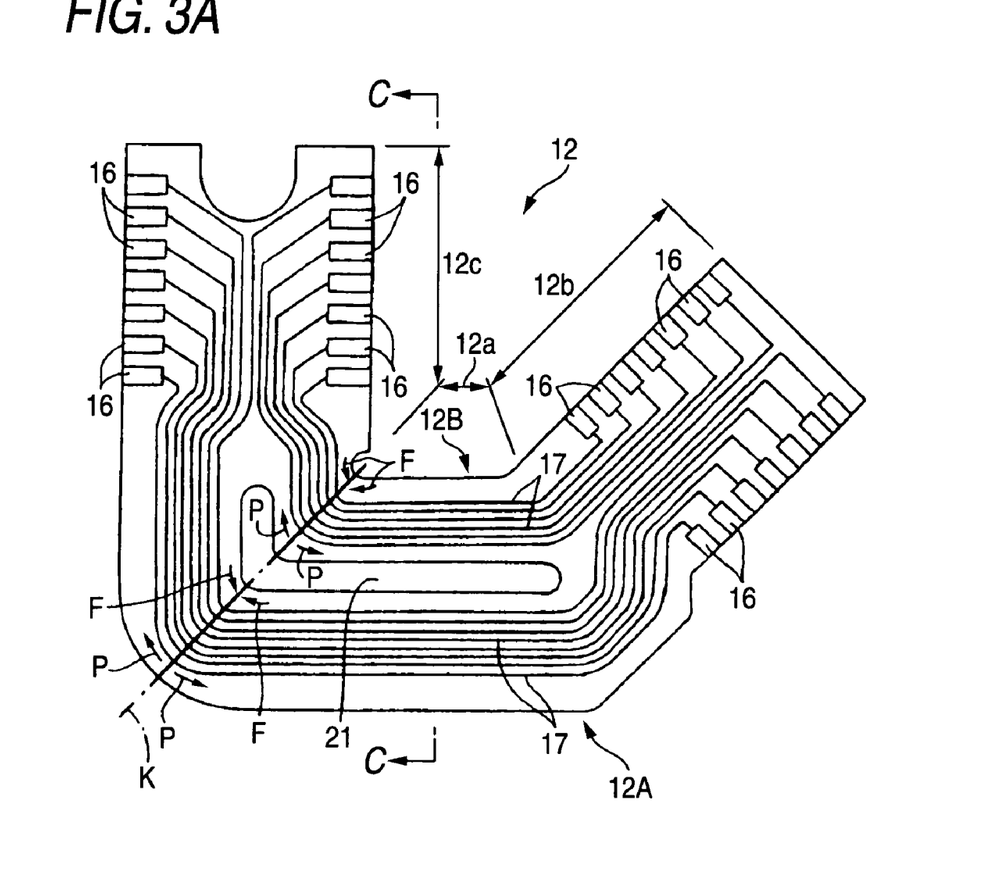
FIG. 3A is a development view of a photo detector conducting wire of an optical pickup according to another embodiment of the present, invention.
Figure 3B:
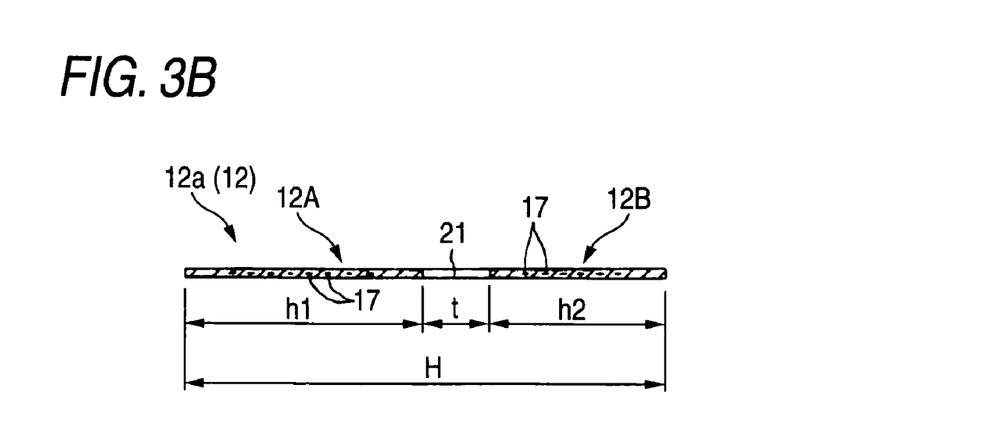
FIG. 3B is a diagram along arrow C-C of FIG. 3A.

FIGS. 3A and 3B show major parts of an optical pickup according, to a third embodiment of the present invention. FIG. 3A is a development view of a photo detector conducting wire of the optical pickup, and FIG. 3B is a view along arrow C-C of FIG. 3A.

As shown in FIGS. 3A and 3B the ratio of the width h1 of the outer conducting wire 12A to the width h2 of the inner conducting wire 12B is set to 7 to 5. Since other configurations are approximately the same as those shown in FIGS. 1A and 1B, a same reference number is assigned to a same portion, and a description thereof is omitted here.

To describe an example of specific measurements, the width H of the center portion 12a is 14 mm, the width t of the slit 21 is 2 mm, the width h1 of the outer conducting wire 12A is 7 mm, and the width h2 of the inner conducting wire 12B is 5 mm.

In the above-described configuration, FIGS. 1A and 1B show a case where the ratio of the width h1 of the outer conducting wire 12A to the width h2 of the inner conducting wire 12B is 3 to 1 (in a detailed example, 9 mm to 3 mm). When the ratio is smaller than 3 to 1, that is, when the width h2 of the inner conducting wire 12B decreases from a state shown in FIGS. 1A and 1B, the pulling force P and the compressing force F that are applied to the inner conducting wire 12B do not act oh the adhesive agent 14 that supports, the photo detector PD1. However, since the width h1 of the outer conducting wire 12A is increased in correspondence with a decrease in the width h2 of the inner conducting wire 12B, the shape of the photo detector conducting wire is approximately the same as the shape of a general photo detector conducting wire shown in FIGS. 8A and 8B. Accordingly, the pulling force P and the compressing force F that are applied, to the outer conducting wire 12A become, considerably strong, and act on the adhesive agent 14 that supports the photo detector PD1. Therefore, the adhesive agent 14 is deformed in a case where the adhesive agent is exposed in a high-temperature environment such as a curing process or a warehouse. As a result, the three-dimensional adjustment XYZ and rotation adjustment T of the photo detector PD1 may be performed incorrectly, and thereby there is a possibility of generation of a read error.

FIGS. 3A and 3B show a case, where the ratio of the width h1 of the outer conducting wire 12A to the width K-2 of the inner conducting wire 12B is 7 to 5 (in a detailed example, 7 mm to 5 mm). When the ratio exceeds the ratio of 7 to 5, that is, when, the width h2 of the inner conducting wire 12B is increased from a state shown in FIGS. 3A and 3B, the width h2 of the inner conducting wire 12B is not quite different from the width h1 of the outer conducting wire 12A. Accordingly, the shape of the photo detector conducting wire is approximately the same as the shape of a general photo detector conducting wire shown in FIGS. 9A and 9B. Thus, the pulling force p and the compressing force F that are applied to the inner conducting wire 12B become, considerably strong, and act on the adhesive agent 14 that supports the photo detector pd1. Therefore, the adhesive agent 14 is deformed in a case where the adhesive agent is exposed to a high-temperature environment such as a curing process or a warehouse, and accordingly, there is the above-described defect.

FIGS. 2A and 2B show a case where the ratio of the width h1 of the outer conducting wire 12A to the width h2 of the inner conducting wire 12B is 2 to 1 (in a detailed example, 8 mm to 4 mm) as an example that is the most appropriate to the present invention. It is preferable that the ratio is in the range of 2.5 to 1 (in the detailed example, 8.6 mm to 3.4 mm) to 1.5 to 1 (in the detailed example, 7.2 mm to 4.8 mm).

According to an embodiment of the present Invention, the ratio of the width h1 of the outer conducting wire 12A to the width h2 of the inner conducting wire 12B is set to be in the range of 3 to 1 (see FIGS. 1A and 1B) to 7 to 5 (see FIGS. 3A and 3B) (preferably in the range of 2.5 to 1 to 1.5 to 1 (see. FIGS. 2A and 2B)). In addition, by dividing the center portion 12a of the photo detector conducting wire 12 into two including the outer conducting wire 12 A and the inner conducting wife 12B, the pulling force P and the compression force. F that are applied to the photo detector conducting wire 12 are dispersed to both the inner and outer conducting wires 12A and 12B. In addition, the width h2 of the inner conducting wire 12B is set to be appropriately smaller than the width h1 of the outer conducting wire 12A. Accordingly, the inner conducting wire 12B can be easily bent in correspondence with a decrease in the width h2, and thus the pulling force P and the compressing force F that are applied to the inner conducting wire decrease. As a result, the pulling force P and the compression force F that are applied to the inner conducting wife 12B scarcely act on the adhesive agent 14 that supports the photo detector PD1, and accordingly, the adhesive agent 14 is not deformed in a case where the adhesive agent is exposed to a high-temperature environment such as a curing process or a warehouse. Therefore, the three-dimensional adjustment XYZ and rotation adjustment T of the photo detector PD1 can be maintained for a long time, and thus a read error can be prevented.

In FIGS. 1A to 3B, a ease where, the width t of the slit 21 is set to 2 mm. However, when, the width t of the slit 21 is smaller than 1 mm, the width t of the slit 21 is too small. Accordingly, both the inner and outer-conducting wires 12A and 12B may be brought into contact with each other in a case where the other end portion 12c of the photo detector conducting wire 12 is bent in the boundary K, and thereby there is a possibility that remaining load is applied to the adhesive agent 14.

When the width t of the slit 21 exceeds 3 mm, the width t of the slit 21 is too large. Thus, the width h1+h2 of both the conducting wires 12A and 12B is decreased in correspondence with an increase in the width of the slit. Therefore, it is difficult, to appropriately dispose a plurality of the connection wires 17 in both the inner and outer conducting wires 12A and 12B with a predetermined gap interposed therebetween.

According to an embodiment of the present invention, since the width t of the slit 21 is set in the range of 1 to 3(preferably in the range of 1.5 to 2) mm, the width t of the slit 21 is appropriately set. Accordingly, both the inner and outer conducting wires 12A and 12B are hot brought into contact with each other in a case where the other end portion 12c of the photo detector conducting wire 12 is bent in the boundary K. In addition, the width h1+h2 of both the inner and outer conducting wires 12A and 12B can be set large as possibly as can be, and accordingly, a plurality of connection, wires 17 can be appropriately disposed in both the inner and outer conducting wires 12A and 12B with a predetermined gap interposed therebetween.

What is claimed is:

1. An optical pickup comprising:
   a slide base adapted to move along a radial direction of a disc and having: a first surface; and a second surface;
   a first substrate fixed to the first surface and comprising a printed circuit board;
   a standing frame disposed on the second surface;
   a second substrate facing the standing frame and comprising a printed circuit board;
   a laser diode operable to emit a laser beam to the disc and disposed in the standing frame;
   an optical element supported by the second substrate and adapted to receive a light beam reflected from the disc; and
   a flexible flat cable including: a first end portion; a second end portion; and a curved portion disposed between the first end portion and the second end portion, wherein:
   the first end portion is connected to the first substrate;
   the flexible flat cable is bent so that the second end portion is connected to the second substrate;
   the curved portion is formed with a slit elongated in a longitudinal direction of the flexible flat cable and defining an outer portion and an inner portion; and
   a width of the inner portion is narrower than a width of the outer portion.

2. The optical pickup according to claim 1, wherein the width of the outer portion is 1.4 to 3 times wider than the width of the inner portion.

3. The optical pickup according to claim 2, wherein the width of the outer portion is 1.5 to 2.5 times wider than the width of the inner portion.

4. The optical pickup according to claim 1, wherein a width of the slit falls within a range from 1 mm to 3 mm.

5. The optical pickup according to claim 4,
   wherein the width of the slit falls within a range from 1.5 to 2.5 mm.

6. The optical pickup according to claim 1,
   wherein the flexible flat cable is bent at the curved portion.

* * * * *